(12) United States Patent
Chen et al.

(10) Patent No.: US 8,934,281 B2
(45) Date of Patent: Jan. 13, 2015

(54) BIT SET MODES FOR A RESISTIVE SENSE MEMORY CELL ARRAY

(75) Inventors: Yiran Chen, Eden Prairie, MN (US); Daniel S. Reed, Maple Plain, MN (US); Yong Lu, Edina, MN (US); Harry Hongyue Liu, Maple Grove, MN (US); Hai Li, Eden Prairie, MN (US); Rod V. Bowman, Bloomington, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 588 days.

(21) Appl. No.: 13/274,876

(22) Filed: Oct. 17, 2011

(65) Prior Publication Data

US 2012/0033482 A1  Feb. 9, 2012

Related U.S. Application Data

(63) Continuation of application No. 12/352,693, filed on Jan. 13, 2009, now Pat. No. 8,040,713.

(51) Int. Cl.
*G11C 11/00* (2006.01)
*G11C 11/16* (2006.01)
*G11C 11/56* (2006.01)
*G11C 13/00* (2006.01)

(52) U.S. Cl.
CPC ............ *G11C 11/16* (2013.01); *G11C 11/5685* (2013.01); *G11C 13/0007* (2013.01); *G11C 13/0026* (2013.01); *G11C 13/0069* (2013.01)
USPC .......................................... 365/148; 365/163

(58) Field of Classification Search
CPC ........... G11C 13/0069; G11C 13/0002; G11C 13/0064; G11C 13/0097; G11C 13/0003; G11C 13/0004; G11C 2013/0069; G11C 2013/0085; G11C 2013/0088; G11C 2213/51
USPC .................................................. 365/148, 163
See application file for complete search history.

(56) References Cited

U.S. PATENT DOCUMENTS

| | | | |
|---|---|---|---|
| 6,341,085 B1 | 1/2002 | Yamagami et al. | |
| 6,757,842 B2 | 6/2004 | Harari et al. | |
| 6,940,742 B2 | 9/2005 | Yamamura | |
| 7,045,840 B2 | 5/2006 | Tamai et al. | |
| 7,057,922 B2 * | 6/2006 | Fukumoto | 365/158 |
| 7,362,618 B2 | 4/2008 | Harari et al. | |
| 7,397,713 B2 | 7/2008 | Harari et al. | |
| 7,511,985 B2 * | 3/2009 | Horii et al. | 365/148 |
| 7,542,356 B2 | 6/2009 | Lee et al. | |
| 7,646,629 B2 | 1/2010 | Hamberg et al. | |
| 7,688,620 B2 | 3/2010 | Lee et al. | |
| 7,732,881 B2 | 6/2010 | Wang | |
| 7,903,447 B2 * | 3/2011 | Lung | 365/148 |
| 2008/0170428 A1 * | 7/2008 | Kinoshita | 365/148 |
| 2009/0046500 A1 | 2/2009 | Lee et al. | |

* cited by examiner

*Primary Examiner* — VanThu Nguyen
(74) *Attorney, Agent, or Firm* — Hall Estill Attorneys at Law

(57) ABSTRACT

Various embodiments of the present invention are generally directed to a method and apparatus for providing different bit set modes for a resistive sense memory (RSM) array, such as a spin-torque transfer random access memory (STRAM) or resistive random access memory (RRAM) array. In accordance with some embodiments, a group of RSM cells in a non-volatile semiconductor memory array is identified for application of a bit set operation. A bit set value is selected from a plurality of bit set values each separately writable to the RSM cells to place said cells in a selected resistive state. The selected bit set value is thereafter written to at least a portion of the RSM cells in the identified group.

20 Claims, 6 Drawing Sheets

BIT SET MODES FOR A RESISTIVE SENSE MEMORY CELL ARRAY

RELATED APPLICATION

This application is a continuation of copending U.S. patent application Ser. No. 12/352,693 filed Jan. 13, 2009.

BACKGROUND

Data storage devices generally operate to store and retrieve data in a fast and efficient manner. Some storage devices utilize a semiconductor array of solid-state memory cells to store individual bits of data. Such memory cells can be volatile or non-volatile. Volatile memory cells generally retain data stored in memory only so long as operational power continues to be supplied to the device. Non-volatile memory cells generally retain data stored in memory even in the absence of the application of operational power.

So-called resistive sense memory (RSM) cells can be configured to have different electrical resistances to store different logical states. The resistance of the cells can be subsequently detected during a read operation by applying a read current and sensing a signal in relation to a voltage drop across the cell. Exemplary types of RSM cells include resistive random access memory (RRAM), magnetic random access memory (MRAM), spin-torque transfer random access memory (STTRAM or STRAM), etc.

SUMMARY

Various embodiments of the present invention are generally directed to a method and apparatus for providing different bit set modes for a resistive sense memory (RSM) array, such as a spin-torque transfer random access memory (STRAM) or resistive random access memory (RRAM) array.

In accordance with some embodiments, a method generally comprises identifying a group of resistive sense memory (RSM) cells in a non-volatile semiconductor memory array to be subjected to a bit set operation; selecting a bit set value from a plurality of bit set values each separately writable to said cells to place said cells in a selected resistive state; and writing the selected bit set value to at least a portion of the RSM cells in said group.

In accordance with other embodiments, an apparatus generally comprises a non-volatile semiconductor memory array of resistive sense memory (RSM) cells; and a controller configured to execute a bit set operation by identifying a group of said RSM cells, selecting a bit set value from a plurality of bit set values each separately writable to said cells to place said cells in a selected resistive state, and writing the selected bit set value to at least a portion of the RSM cells in said group.

In accordance with other embodiments, an apparatus generally comprises a non-volatile semiconductor memory array of resistive sense memory (RSM) cells; and first means for executing a bit set operation upon a group of said RSM cells to set each RSM cell in said group to a selected bit value from a plurality of bit set values each separately writable to said RSM cells, and each separately overwritable to a new value.

These and various other features and advantages which characterize the various embodiments of the present invention can be understood in view of the following detailed discussion in view of the accompanying drawings.

DETAILED DESCRIPTION

Figure 1:
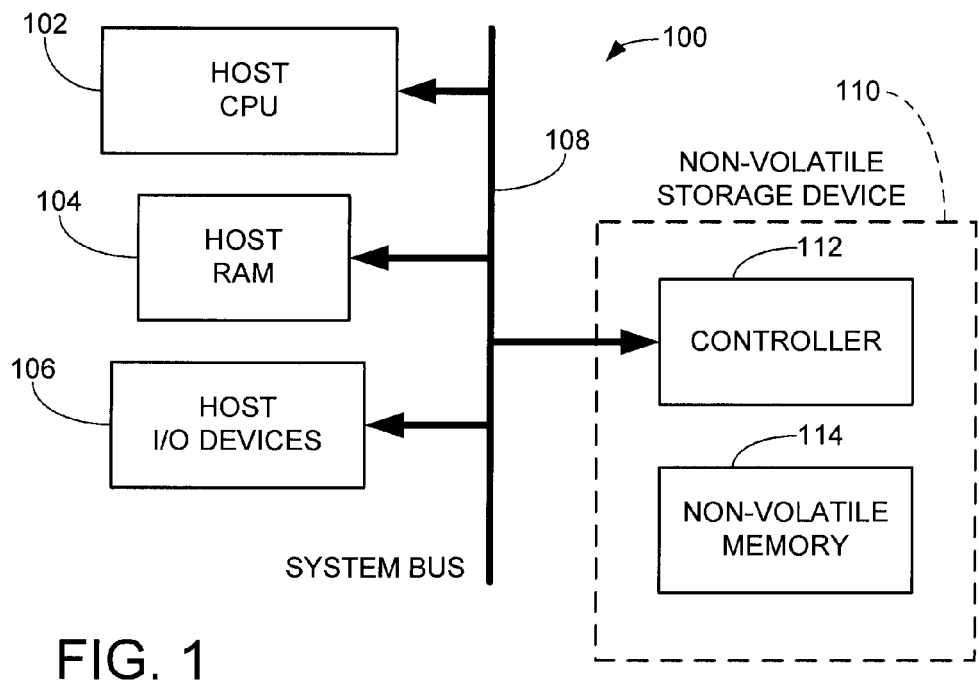
FIG. 1 shows a functional representation of an exemplary host device coupled to a data storage device constructed and operated in accordance with various embodiments of the present invention.

FIG. 1 is a functional block representation of an exemplary environment in which various embodiments of the present invention can be practiced. A host device is denoted at 100 and is characterized as a processor based device, such as a personal computer, hand-held electronic device, etc.

The host device 100 includes a central processing unit 102, host random access memory (RAM) 104 and a number of host I/O devices 106. The host I/O devices can include a graphical user interface, peripherals utilized by the host device such a printer or a network I/O card, etc. These constituent elements of the host device communicate via a system bus 108.

A non-volatile data storage device 110 is coupled to the host device to provide non-volatile storage of data for use by the host device. The data storage device 110 can be integrated to form a portion of the host device 100, or can be a removeable component that is selectively mated with the host device, such as a removeable drive, memory stick, PCMCIA card, etc.

The data storage device 110 generally includes a device level controller 112 and a non-volatile memory 114. The controller 112 can take a number of forms, such as a programmable CPU. The memory 114 provides an array memory space and may serve as a main memory for the host device 100.

Figure 2:
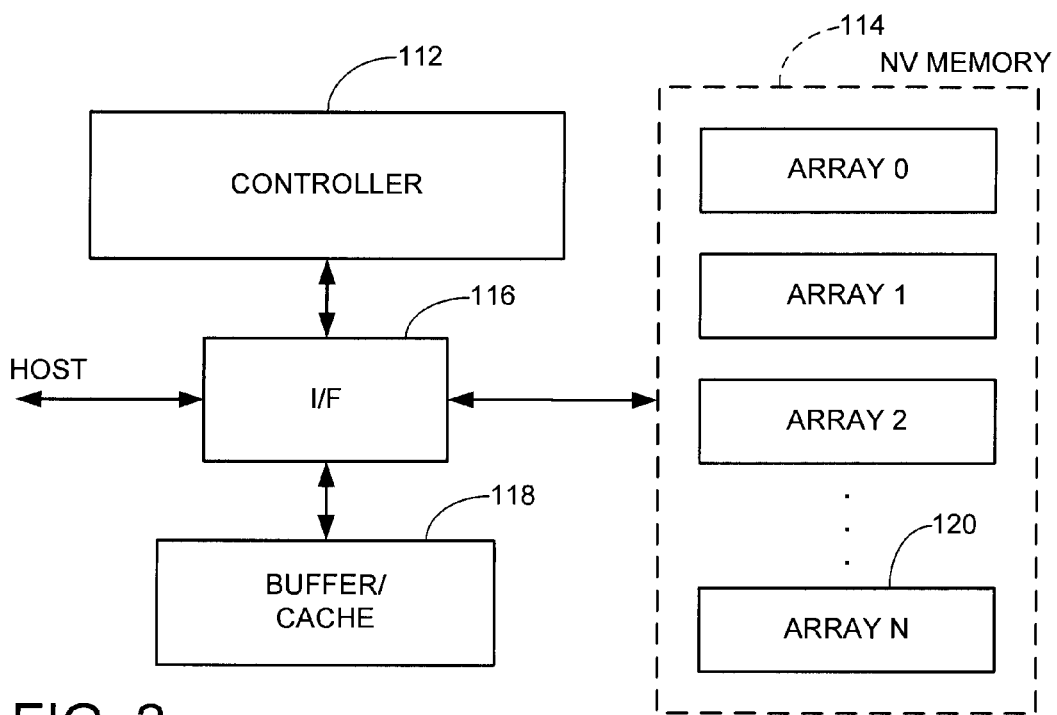
FIG. 2 shows a functional block diagram of the data storage device of FIG. 1.

FIG. 2 provides a functional block representation of the data storage device 110. An interface (I/F) block 116 provides host and controller I/O functions. A buffer/cache block 118 can be used as desired to provide local caching of data during device operation. In some embodiments, the block 118 serves to temporarily store input write data from the host device 100 and readback data pending transfer to the host device, as well as to facilitate serialization/deserialization of the data during a transfer operation. The buffer can be located in any suitable location, including in a portion of the memory 114.

While not limiting, in an embodiment the various circuits depicted in FIG. 2 are arranged as a single chip or chip set formed on one or more semiconductor dies with suitable encapsulation, housing and interconnection features (not separately shown for purposes of clarity). Input power to operate the data storage device 110 is handled by a suitable power management circuit and can be supplied via the host device 100 from a suitable source such as from a battery, AC power input, etc.

Figure 3:
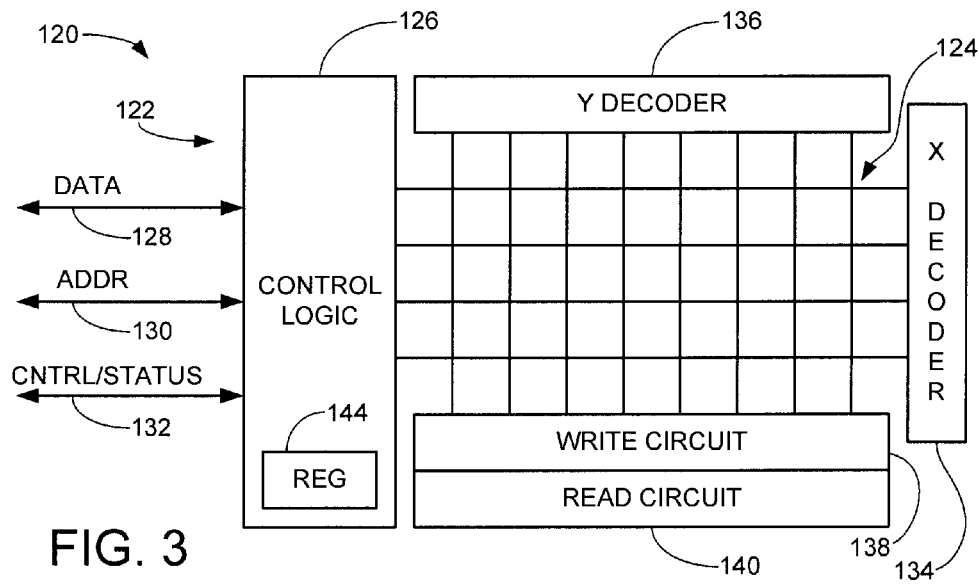
FIG. 3 shows circuitry used to read data from and write data to a memory array of the data storage device of FIG. 2.

FIG. 3 generally illustrates operation of a selected array 120 of FIG. 2. In some embodiments, each array is a separate integrated circuit chip 122. Data are stored in each array in memory cells 124, which are arranged into rows and columns. The memory cells 124 are accessible by various row (word) and column (bit) lines, etc. The actual configurations of the cells and the access lines thereto will depend on the requirements of a given application. Generally, however, it will be appreciated that various other control lines will generally include enable lines that selectively enable and disable the respective writing and reading of the value(s) of the individual cells.

Control logic 126 receives and transfers data, addressing information and control/status values along multi-line bus paths 128, 130 and 132, respectively. X and Y decoding circuitry 134, 136 provide appropriate switching and other functions to access the appropriate cells 124. As desired, adjacent arrays can be configured to share a single Y (row) decoder 136 to reduce RC delay effects along an associated word line.

A write circuit 138 represents circuitry elements that operate to carry out write operations to write data to the cells 124, and a read circuit 140 correspondingly operates to obtain readback data from the cells 124. Local buffering of transferred data and other values can be provided via one or more local registers 144. At this point it will be appreciated that the circuitry of FIG. 3 is merely exemplary in nature, and any number of alternative configurations can readily be employed as desired depending on the requirements of a given application.

The memory cells 124 are characterized as so-called resistive sense memory (RSM) cells. As used herein, RSM cells are generally described as cells configured to have different electrical resistances which corresponds to different logical states. The resistance of the cells can be subsequently detected during a read operation by applying a read current and sensing a signal in relation to a voltage drop across the cell. Exemplary types of RSM cells include resistive random access memory (RRAM), magnetic random access memory (MRAM), spin-torque transfer random access memory (STTRAM or STRAM), etc.

Advantages of RSM cells over other types of non-volatile memory cells such as EEPROM and flash include the fact that no floating gate is provided in the cell construction. No erase operation is necessary prior to the writing of new data to an existing set of cells. Rather, RSM cells can be individually accessed and written to any desired logical state (e.g., a "0" or "1") irrespective of the existing state of the RSM cell. Also, write and read power consumption requirements are substantially reduced, significantly faster write and read times can be achieved, and substantially no wear degradation is observed as compared to erasable cells, which have a limited write/erase cycle life.

Figure 4:
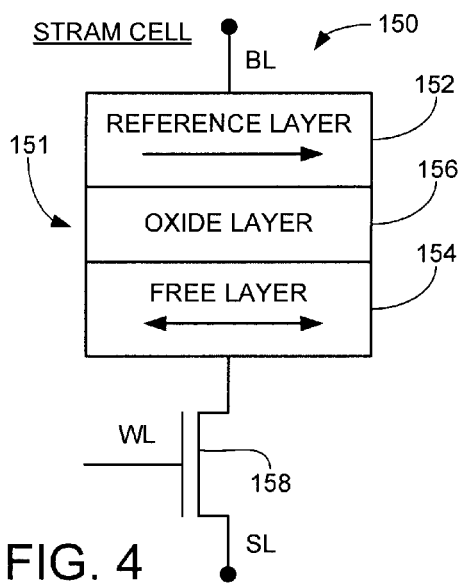
FIG. 4 shows an exemplary construction of a resistive sense memory (RSM) cell characterized as a spin-torque transfer random access memory (STTRAM or STRAM) cell.

FIG. 4 shows an exemplary RSM cell, characterized as an STRAM cell 150. The STRAM cell 150 includes a magnetic tunneling junction (MTJ) 151 with two ferromagnetic layers 152, 154 separated by an oxide barrier layer 156 (such as magnesium oxide, MgO). The resistance of the MTJ 151 is determined in relation to the relative magnetization directions of the ferromagnetic layers 152, 154: when the magnetization is in the same direction (parallel), the MTJ is in the low resistance state ($R_L$); when the magnetization is in opposite directions (anti-parallel), the MTJ is in the high resistance state ($R_H$).

In some embodiments, the magnetization direction of the reference layer 152 is fixed by coupling to a pinned magnetization layer (e.g., a permanent magnet, etc.), and the magnetization direction of the free layer 154 can be changed by passing a driving current polarized by magnetization in the reference layer 152. To read the logic state stored by the MTJ 151, a relatively small current is passed through the MTJ between a source line (SL) and a bit line (BL). Because of the difference between the low and high resistances of the MTJ in the respective logical 0 and 1 states, the voltage at the bit line will be different, and this can be sensed using a sense amplifier or other circuitry. A switching device 158, such as an NMOSFET (transistor), provides access to the STRAM cell 150 when a control gate voltage is asserted, such as via a word line (WL).

Figure 5:
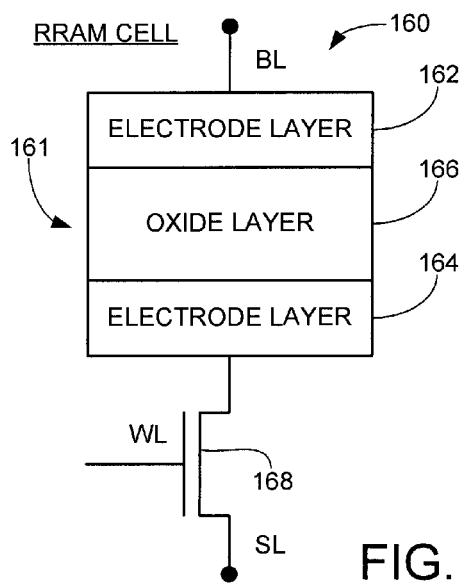
FIG. 5 shows an exemplary construction of a resistive sense memory (RSM) cell characterized as a resistive random access memory (RRAM) cell.

FIG. 5 generally illustrates an alternative embodiment of the RSM cells 124 in which an RRAM construction is used. An RRAM cell 160 includes a resistive sense element (RSE) 161 with opposing electrode layers 162, 164 and an oxide layer 166. The oxide layer 166 may be configured to have a nominally high voltage (e.g., $R_H$). The resistance of the oxide layer, however, can be lowered (e.g., $R_L$) through application of a relatively high write voltage across the RRAM cell 160. Such voltage generates lower resistance paths (filaments) as components of a selected electrode layer 162, 164 migrate into the oxide layer 166.

The oxide layer 166 can be restored to its original, higher resistance through application of a corresponding voltage of opposite polarity. As with the MTJ 151 of FIG. 4 (which also constitutes a "resistive sense element" for purposes herein), the storage state of the RSE 161 in FIG. 5 can be read by passing a read current from a source line (SL) to a bit line (BL), and sensing the resistance of the cell. As before, a switching device 168 provides selective access to the RRAM cell 160.

Figure 6:
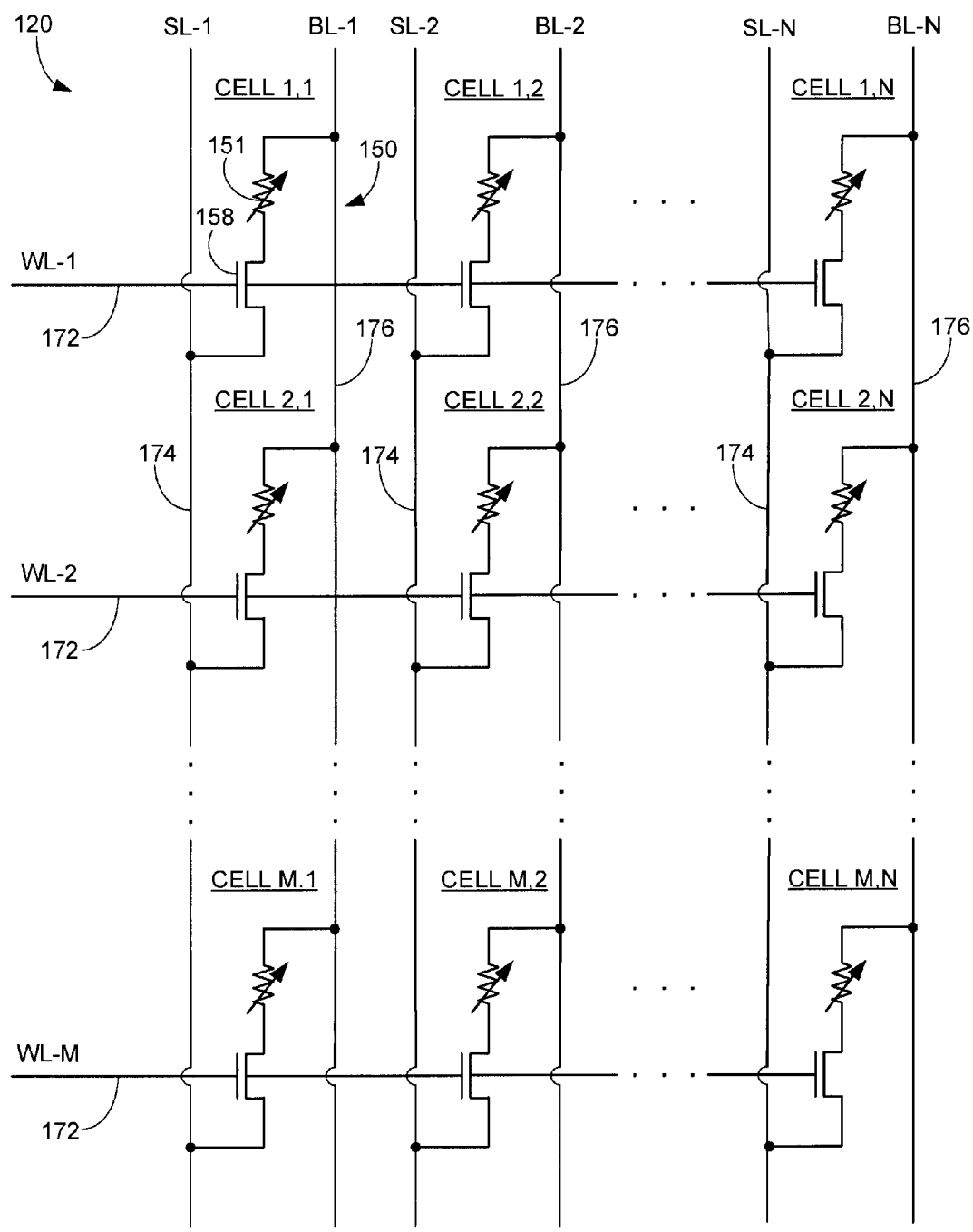
FIG. 6 is a schematic representation of an array of STRAM cells.

FIG. 6 provides a schematic depiction of a number of RSM memory cells of the array 120 of FIG. 2, herein characterized as STRAM cells 150. The cells 150 each include an MTJ 151 and a switching device 158. The array 120 is arranged into M rows and N columns, with each cell having a coordinate designation of from cell 1,1 to cell M,N.

Each row of cells 150 is arranged and interconnected along a common word line 172. The word lines 172 are denoted as WL-1, WL-2 ... WL-N, and each word line connects the gates of the switching devices 158 along each row. Source lines 174 are denoted as SL-1, SL-2 ... SL-N, and bit lines 176 are denoted as BL-1, BL-2 ... BL-N. It will be appreciated that other configurations can be readily implemented, so that the configuration of FIG. 6 is merely exemplary and not limiting.

To write a selected cell such as cell 1,1, the WL-1 word line 172 is asserted to place the switching device 158 of cell 1,1 into a conductive state. It is noted that the assertion of the WL-1 word line 172 similarly places all of the switching devices 158 along the associated row into a conductive state. The associated SL-1 source line 174 and BL-1 bit line 176 are coupled to a current driver (not separately shown in FIG. 6) to drive the desired write current through the MTJ 151 in the desired direction. The remaining source and bit lines not connected to cell 1,1 can be appropriately configured (such as in a state of high impedance) to prevent inadvertent writing to these other cells along the selected row.

To read the written state of the cell 1,1, the WL-1 word line 172 is again asserted. The SL-1 source line 174 is placed at an appropriate reference level (such as ground), and a read current is passed along the BL-1 bit line and through the cell. The voltage drop $V_{CELL}$ across the cell is sensed by a sense amplifier or other suitable circuitry (not shown in FIG. 6) and compared to a reference voltage $V_{REF}$. The resistive state (e.g., $R_L$ or $R_H$) and hence, the stored logical state (e.g., logical 0 or 1) is output by the sense amplifier in relation to the respective $V_{CELL}$ and $V_{REF}$ voltage levels.

Two or more bits per cell can alternatively be stored as desired, such as by controllably programming different levels of resistances of the MTJ 151 (e.g., $R_1<R_2<R_3<R_4$). Appropriate reference voltages (e.g., $V_{REF1}<V_{REF2}<V_{REF3}$) can be used to sense these respective resistances. In the foregoing example, the four resistances can be used to store two bits of data (e.g., 00, 01, 10 or 11, respectively). More generally, $2^N$ resistance levels can be used to store N bits per cell. When two or more bits are stored per cell, all of the bits can be used to represent stored data, or one or more bits can be used to provide other types of control data such as a cell flag, etc.

As noted above, an advantage of the use of RSM cells such as the STRAM cells 150 in FIG. 6 is the ability to directly overwrite any existing logical state to a new logical state. By contrast, erasable cells such as flash or EEPROM require erasing to a first state because such cells can only be written in a single direction to a second state. Such erasable cells are erased by applying a relatively large voltage to remove charge from the cell floating gate structures. An uncharged floating gate structure thus constitutes a selected logical level, such as logical 1. The cells are subsequently written by subsequently adding charge to the floating gate structure, which also requires the application of a relatively large voltage to the cell. Thus, to write a multi-bit value such as 0101 to four flash cells, the first and third cells in the sequence are written to logical 0 and the second and fourth cells remain at logical 1.

In accordance with various embodiments, the cells 150 of FIG. 6 are subjected to bit set modes wherein one, some or all of the cells are configured to have the same storage state. This can be advantageous for a variety of reasons, including security and operational efficiencies. Unlike the erasable cells discussed above, the RSM cells can be bit set to any desired value. Indeed, different bit set values can be used at different times, and different bit set values can be written to different groups of cells at the same time. For example, a first bit set operation can be used to provide a first group of the cells 150 with one logical value (e.g., logical 0, logical 10, etc.) while another, subsequent bit set operation can be carried out on a second group of cells 150 to provide a different logical value (e.g., logical 1, logical 01, etc.).

More generally, as explained below the various embodiments operate to identify a group of RSM cells in a nonvolatile semiconductor memory array to be subjected to a bit set operation. Once the cells are identified, a bit set value is selected from a plurality of bit set values each separately writable to place the cells in a different resistive state. The selected bit set value is thereafter written to at least a portion of the RSM cells in the identified group. It will be noted that each of the plurality of available bit set values can be subsequently overwritten with a different bit set value without requiring an erase operation to remove charge from the cell.

Figure 7:
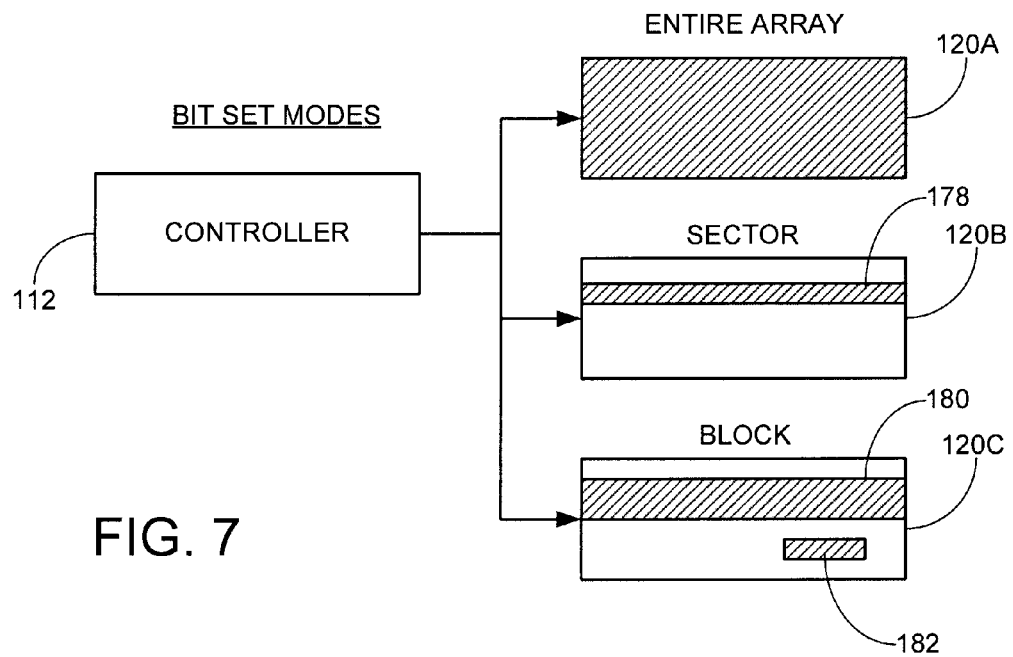
FIG. 7 illustrates different bit set modes of the data storage device.

Various exemplary bit set modes for the data storage device 110 are illustrated in FIG. 7. More specifically, FIG. 7 shows the controller 112 in conjunction with three different arrays 120A, 120B and 120C of the data storage device 110. It will be appreciated that any bit set mode can be applied to any array, as desired.

A global bit set operation is illustrated for the array 120A. The global bit set operation results in the setting of all of the cells 150 in the array to a desired value, as indicated by the cross-hatched section of FIG. 7.

Alternatively, the controller 112 can command a sector level bit set operation, as shown for array 120B. In some embodiments, each array is arranged into a plurality of sectors 178, with each sector 178 constituting an addressable block of data with an associated logical block address (LBA) used by the host device 100 to address the associated data. In FIG. 7, the exemplary sector 178 is shown to constitute all of the cells 150 across an entire row of each array. Other embodiments are readily contemplated, however, such as sectors that take up less than a full row, sectors that span multiple rows (or columns) of cells, etc.

A multi-sector bit set operation is shown at 180 for the array 120C. The multi-sector bit set operation sets the cells 150 in two or more sectors to a desired value. A block level bit set operation is shown at 182 for the array 120C. The block level bit set operation serves to set smaller blocks of cells to the desired value. These respective granularities provide flexibility during device operation.

Figure 8:
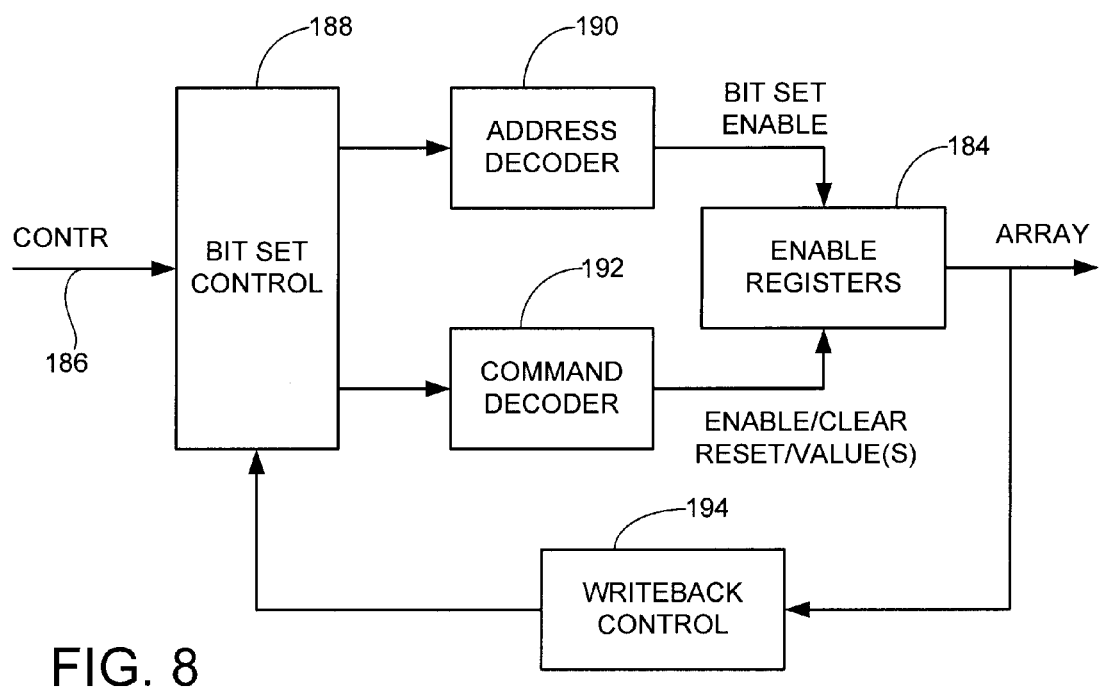
FIG. 8 provides a functional block diagram of bit set mode circuitry of the data storage device.

The bit set operations of FIG. 7 are carried out such as set forth by FIG. 8. Bit set enable registers 184 operate to select (tag) the associated cells, such as on a global basis, sector basis, block basis, etc. Bit set commands are received from the controller 112 (CONTR) via path 186 by a bit set control block 188, which passes data address and access command data to respective address and command decoders 190, 192. The address decoder 190 decodes the address to identify the corresponding memory cells/blocks/sectors/arrays. The command data are decoded by the command decoder 192, which generates various control signals such as ENABLE (to start the bit set operation), CLEAR (to deselect certain addresses from being set), RESET (to conclude the bit set operation), VALUE (to identify the value to be written to each of the bit set cells), etc.

To carry out a bit set operation for a particular sector i in an associated array 120, the controller 112 sends the address of the sector i to the bit set control block 188. The address is decoded and is used in combination with an ENABLE signal from the command decoder 192 to enable the bit set enable registers 184 to initiate the bit set operation.

The bit set operation can be generally considered to be carried out as an otherwise conventional write operation in which the selected value is written to each of the selected cells. Accordingly, the actual bit set operation at the array level (e.g., FIG. 6) can be carried out in relation to the particular configuration and capabilities of the row and column drivers, decoders and read/write circuitry (see e.g., FIG. 3).

In some embodiments, multiple cells are written simultaneously, such as at a byte, block or sector level. In other embodiments, the cells are written sequentially. While not required, in various embodiments a write-read verify operation takes place such that, after the set value is written, the written cell is read to ensure the correct value was stored in the cell.

It is contemplated that in some embodiments a given memory array 120 will have data that should be retained. Such data ("protected data") should not be subjected to overwriting during a bit set operation. Protected data can include overhead or status data such as defect management data, flag bits, programming routines used by the controller 112 or CPU 102 (FIG. 1), etc.

The bit set operation is highly configurable in that, regardless of mode, specific cells that store protected data can be identified and exempted from the bit set operation. In such embodiments, the cells that store protected data remain undisturbed during the bit set operation. By way of illustration, a bit set operation can be commanded for the cells 150 in FIG. 6 along a common word line, such as the WL-2 word line 172. A selected cell 150 along the WL-word line 172, such as cell 2,2, can be deselected from the bit set operation. The bit set operation is applied to the remaining cells along that row. Cell 2,2 is not written during the bit set operation, and thus retains the resistive state it had prior to the bit set operation on the remaining row cells.

In other embodiments, the protected data are initially read back and temporarily stored (cached) in a temporary memory location. A bit set operation is performed that encompasses the particular cells in the array that stored the protected data. The protected data are then written back to the array, overwriting the bit set values placed in the cells during the bit set operation. A writeback control block 194 in FIG. 8 is configured to coordinate such operations.

Figure 9:
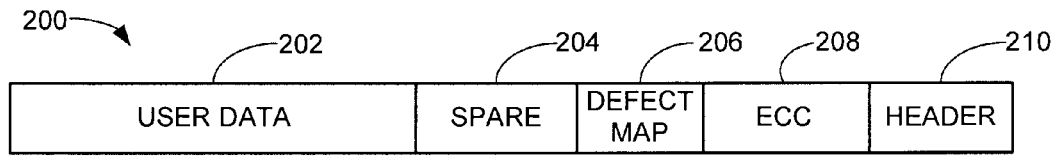
FIG. 9 is an exemplary format for a sector.

FIG. 9 provides an exemplary format for a selected sector 200 (see FIG. 7). As noted above in FIG. 7, the sector 200 can span an entire row (or an entire column) in the associated array 120. Other configurations are readily contemplated including multiple sectors per row (or column), non-contiguous sectors, sectors that "wrap" through the array from one row/column to the next, etc. Sectors such as 200 can further be interleaved with other sectors in the array, and can be grouped together into larger sets of sectors (e.g., 16 sectors) to form ECC blocks, such as used in some types of optical media (e.g., DVDs).

The respective fields shown in FIG. 9 are merely illustrative and are not limiting with regard to order, respective size or type. The exemplary sector 200 stores a fixed amount of user data in a user data field 202. In some embodiments, the sector 200 stores 512 bytes (or other formattable amount) of user data. A spare field 204 provides a suitable number of spare cells to accommodate defects in the sector 200. Such defects can be present as a result of the initial manufacturing process, or can be grown defects that arise during operation and are detected during operation.

The locations of defective cells within the sector 200 are maintained by a defect map field 206. Cells with defects are deallocated, and pointers or other mechanisms are employed in the defect map field to identify where the data that would have otherwise been stored in the defective location are in fact located. In some embodiments, a defective cell can result in a slipping of bits into the spare field 204. In other embodiments, the data that would have otherwise been stored in a defective location are relocated into the spare field. It will be noted that defects can arise from any field in FIG. 9, including in the defect map itself.

An error correction code (ECC) field 208 stores error correction codes, such as parity codes, Reed Solomon codes, etc. that are calculated for the remaining contents of the sector 200. Single or multi-level ECC techniques can be used, including ECC values for multiple sectors (or portions thereof). A header field 210 provides address and other ID control information for the sector 200.

Figure 10:
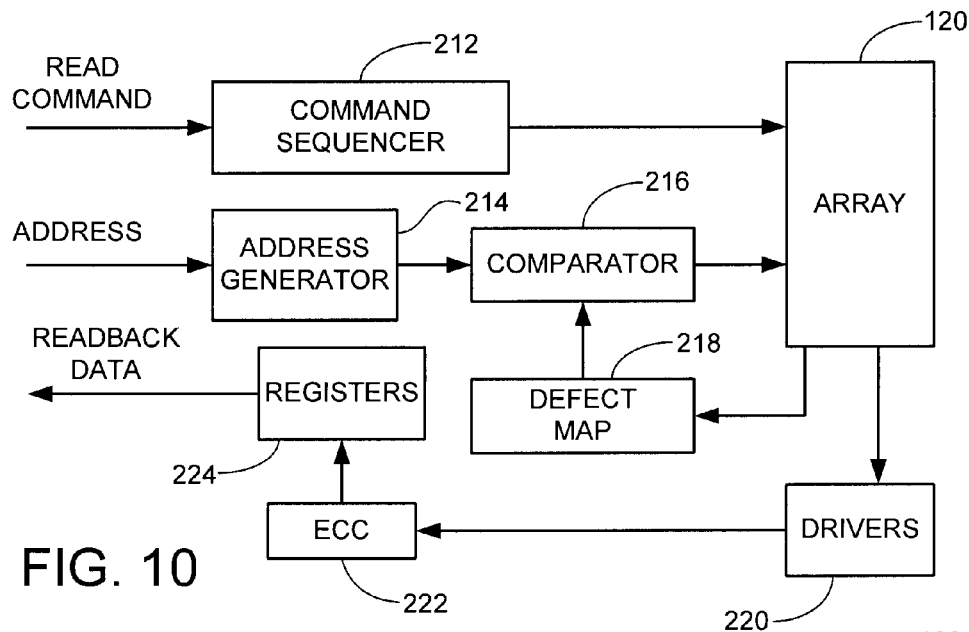
FIG. 10 sets forth a read data control path of the data storage device.

FIG. 10 shows read data path control during the reading of data from a selected array 120. It will be appreciated that some, most or all of the functionality set forth in FIG. 10 can be implemented by the controller 110 (FIG. 2). It is contemplated that the read data path control employs direct memory address (DMA) capabilities during read operations.

A read command, such as from the CPU 102 (FIG. 1) is received, processed and forwarded to a command sequencer 212. The command sequencer operates to coordinate accesses to the array 120, and may include command queuing capability to order and direct multiple pending commands in turn.

The address(es) of the requested data associated with the read command are provided to an address generator 214.

The address generator 214 performs appropriate address processing, including LBA-PBA (logical to physical block address conversion), to identify the specific array addresses to be accessed. The address generator 214 outputs array-level address data to a comparator block 216, which compares the addresses to defect map data from a defect map block 218. In some embodiments, the defect map data are stored in the defect map data fields 206 of the individual sectors 200 (FIG. 9). The defect map data can be alternatively or additionally stored in a central defect map management block in the array. The defect map data can be retrieved prior to or during a particular read operation for the associated sectors. Alternatively, the defect map data for all sectors in the array 120 can be read back during device initialization and maintained in local memory used by the defect map block 218.

If a defect is noted in the address sequence output by the address generator 214, the comparator 216 adjusts the address sequence as discussed above to relocate the affected data to a non-defective cell within the associated sector 200. The adjusted address sequence is forwarded to the array 200 for read back of the associated data therefrom.

The output data are obtained by appropriate drivers 220 which operate as discussed above with reference to FIGS. 3 and 6. The output data are subjected to an ECC block 222 which applies ECC decoding of the read back data. It is contemplated that the ECC block can detect up to a selected number of m errors in a given set of readback data, and can correct up to a selected number of n errors in said data. If the data are successfully recovered with no detected, uncorrectable errors, the data are output to registers 224 for subsequent transfer upstream to the requesting device. If uncorrectable errors are present, a re-read operation takes place, and the device 110 may attempt corrective measures, such as adjustments in read back voltage, reference voltage levels, etc. in an attempt to successfully recover the data.

Figure 11:
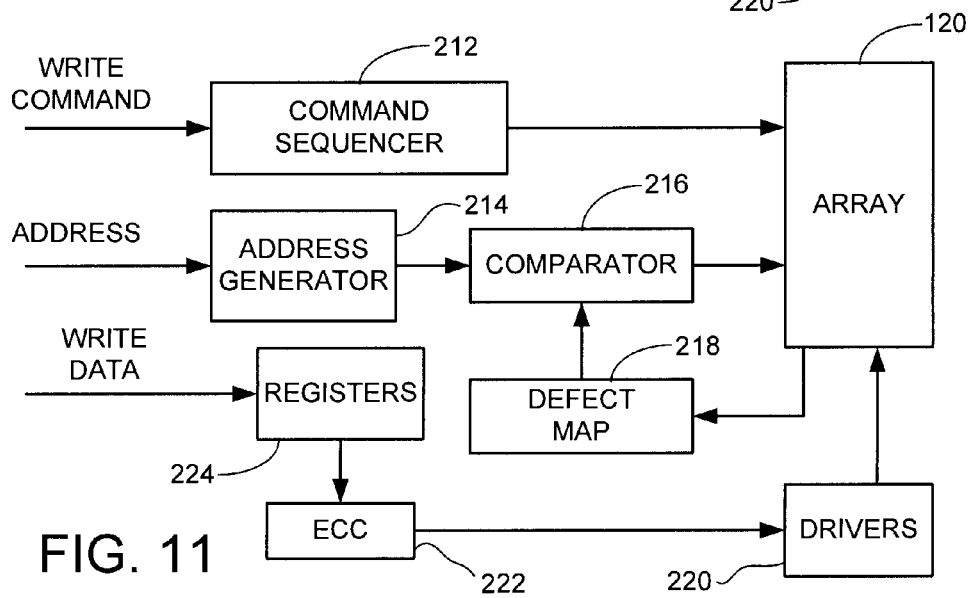
FIG. 11 sets forth a write data control path of the data storage device.

A corresponding write data path control is shown in FIG. 11. The write path utilizes many of the same functional blocks of the read data path control of FIG. 10, and can be considered to substantially operate in reverse fashion. As before, a write command is received and processed by the command sequencer 212. The write command identifies data to be written to the selected array 120.

Associated address data are decoded by the address generator 214 and modified by the comparator 216 and defect map block 218 to identify the appropriate cells to be accessed during the write operation. The actual write data are supplied to the registers 224, subjected to ECC processing by ECC block 222, and written to the array 120 via drivers 220. As desired, the registers 224 can be embodied as the buffer/cache 118 of FIG. 2, or can be part of a pipeline memory structure of the device 110 downstream of the buffer/cache 118.

Figure 12:
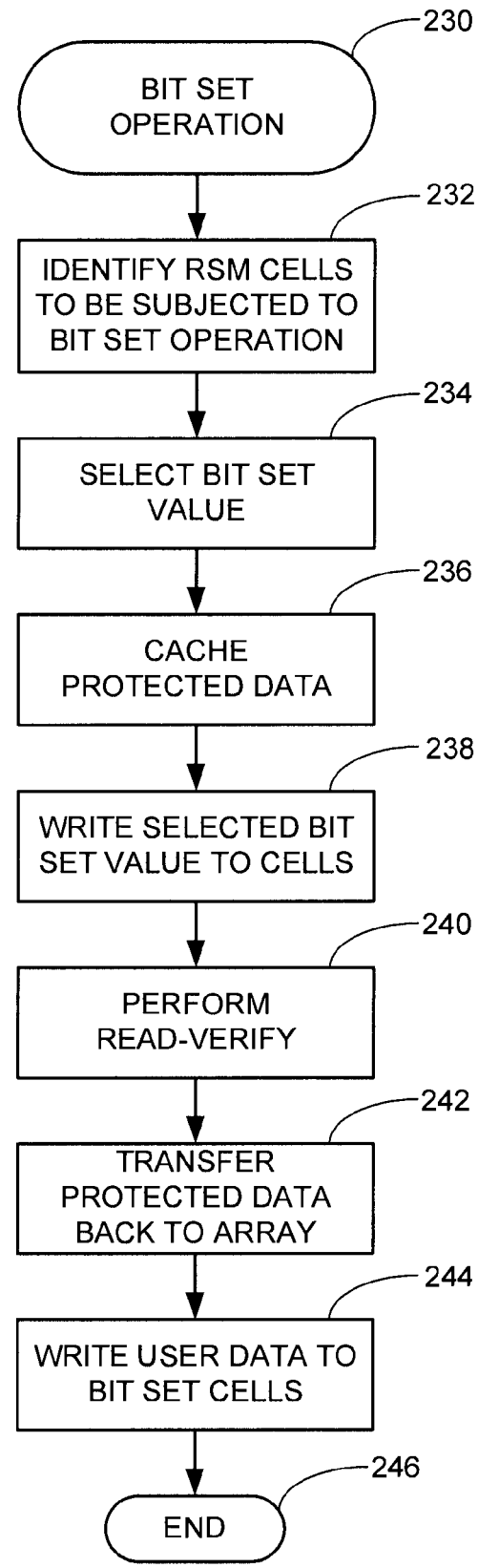
FIG. 12 is a flow chart for a BIT SET OPERATION routine generally illustrative of steps carried out in accordance with various embodiments of the present invention.

FIG. 12 provides a flow chart for a BIT SET OPERATION routine 230, generally illustrative of steps carried out in accordance with various embodiments of the present invention. FIG. 12 generally summarizes the foregoing discussion.

The particular cells to be subjected to a bit set operation are initially identified at step 232. This can be in accordance with the various modes of FIG. 7, such as global, sector level, multi-sector level, block level, etc. In some embodiments, the bit set mode is communicated via the controller 112 to the bit set control block 188 of FIG. 8, so that the cells are identified at this time.

Step 234 identifies the value to which the identified cells are to be set. As noted above, RSM cells can be bit set to any appropriate value, and need not be set to the same value each time. The value can be a single bit (e.g., logical 0 or 1) or a multi-bit value (e.g., logical 01, 11, 1100, etc.).

At step 236, protected data encompassed within the address range of the identified cells are read back and temporarily cached, such as by the writeback control block 194 of FIG. 8. The selected bit set value is thereafter written to the identified cells at step 238. This is carried out such as discussed above with regard to FIGS. 8 and 11.

A read-verify operation is next carried out at step 240 to verify that the selected bit set value was correctly written to each of the identified cells. The protected data (if any) are rewritten to the desired locations in the array at step 242. A write operation is then carried out at step 244 in which new data are written to the bit set cells, and the process ends at step 246. It will be appreciated that the foregoing process can be subsequently carried out for the same cells (or different cells) using a different bit value. Alternatively, the routine of FIG. 12 can be carried out so that a first portion of the cells identified at step 232 are written to a first bit set value, and a second portion of the cells identified at step 232 are written to a different, second bit value.

The various embodiments presented herein provide numerous advantages over the prior art. The ability to carry out bit set operations allow various efficiencies in operation, in that write and read operations are subsequently carried out with known (and verified) initial storage state baselines. Reliability monitoring of the array is improved since defects that arise in the bit set cells can be identified during the read-verify operation. Characteristics of the cells (such as appropriate voltage reference levels) can be set and calibrated.

Control data can also be placed into the array as a result of the flexibility of the bit set operation. For example, in situations where multiple bits are stored in cells, flag bits or other information can be stored as desired. Security of the contents of the array are also enhanced, since the bit set value can be used when data are erased from the array to ensure that no copy of the data are retained by the cells. Different bases for the bit set operation can be stored in relation to the selected bit set value utilized.

For purposes of the appended claims, the term "resistive sense memory (RSM) cell" and the like will be construed consistent with the foregoing discussion to describe a non-volatile memory cell with a resistive sense element (RSE) construction in which different resistances are utilized to establish different storage states, such as but not limited to RRAM, MRAM and STRAM, and excludes structures that include a floating gate or similar structure that requires an erasing operation prior to use such as but not limited to EEPROM, flash, etc. The term "bit set operation" and the like will be defined consistent with the foregoing discussion to describe a write operation whereby one or more bits are written to an RSM cell, each said bit or bits being subsequently overwritable with a new set of bits.

The recited "first means" will be construed consistent with the foregoing discussion to correspond to the controller 112 in conjunction with at least the circuitry of FIG. 8. Structures that erase cells by removing charge from a floating gate are excluded from the definition of an equivalent.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. A data storage device, comprising:
   an array of memory cells arranged into rows and columns, each memory cell comprising a switching device in series with a resistive random access memory (RRAM) element; and
   a controller configured to execute a first bit set operation comprising placing a first group of the memory cells in a lowest resistance state and to subsequently direct a writing of first user data from the host device to the array by overwriting the lowest resistance state of at least one and less than all of the first group of the memory cells, and to execute a second bit set operation comprising placing a second group of the memory cells in a highest resistance state and to subsequently direct a writing of second user data from the host device to the array by overwriting the highest resistance state of at least one and less than all of the second group of the memory cells.

2. The data storage device of claim 1, in which the first group of the memory cells subjected to the first bit set operation constitutes less than all of the memory cells in said array.

3. The data storage device of claim 1, in which the first group of the memory cells subjected to the first bit set operation constitutes all of the memory cells in said array.

4. The data storage device of claim 1, in which the second group of the memory cells subjected to the second bit set operation constitutes less than all of the memory cells in said array.

5. The data storage device of claim 1, in which the second group of the memory cells subjected to the second bit set operation constitutes all of the memory cells in said array.

6. The data storage device of claim 1, in which the controller further operates to read and temporarily store protected data stored in at least a selected one of the first or second group of the memory cells in a separate memory location prior to the overwriting of the memory cells in the selected group, and to transfer the protected data from the separate memory back to the selected group after said overwriting of the memory cells in the selected group.

7. The data storage device of claim 1, in which the controller further performs a read verify operation during each of the first and second bit operations to verify that all of the memory cells in the associated first or second group are in the lowest and highest resistive state, respectively.

8. A solid state semiconductor memory device, comprising:
   a non-volatile memory array of memory cells each comprising a switching device and a resistive random access memory (RRAM) element programmable to different resistive states; and
   a controller coupled to the memory array and adapted to perform a bit set operation to write a selected group of the memory cells to a common baseline resistive state, and to subsequently write user data to the selected group of the memory cells by overwriting a first portion of the cells in said group to a different resistive state and leaving a second portion of the cells in said group in the baseline logical state, the controller further adapted to read and temporarily store protected data stored in the selected group of memory cells in a separate memory location prior to the writing of the selected bit value to all of the memory cells in the selected group, and to transfer the protected data from the separate memory back to the selected group after said writing of the selected bit value to all of the memory cells in the selected group.

9. The memory device of claim 8, in which the controller further operates to carry out a read verify operation upon the selected group of the memory cells after the writing of the selected bit value and prior to the writing of the user data to verify that all of the memory cells in the selected group are in the baseline resistive state.

10. The memory device of claim 8, in which the selected group of memory cells subjected to the bit set operation constitutes less than all of the memory cells in the memory array.

11. The memory device of claim 8, in which the selected group of memory cells subjected to the bit set operation constitutes all of the memory cells in the memory array.

12. The memory device of claim 8, in which the controller executes a first bit set operation to place a first group of the memory cells in a lowest resistance state, directs a writing of first user data from the host device to at least one of the first group of the memory cells to overwrite said lowest resistance state, executes a second bit set operation to place a second group of the memory cells in a highest resistance state, and directs a writing of second user data from the host device to at least one of the second set of the memory cells to overwrite said highest resistance state.

13. The memory device of claim 8, in which each RRAM element comprises opposing first and second conductive electrodes and an intervening layer into which one or more conductive filaments extend during programming of the respective memory cells to a selected resistive state.

14. The memory device of claim 13, in which the baseline resistive state comprises a low resistance state in which said conductive filaments are retracted from the intervening layer.

15. The memory device of claim 8, in which the controller writes the user data to the array responsive to responsive to a write command from a host device coupled to the memory device.

16. A method comprising:
   writing a first group of RRAM memory cells in a data storage array to a first baseline logical state;
   overwriting user data to the first group of RRAM memory cells by programming a first portion of the cells in the first group to a new logical state while maintaining a second portion of the cells in the first group in the first baseline logical state;
   writing a second group of RRAM memory cells in the data storage array to a different, second baseline logical state; and
   overwriting user data to the second group of RRAM memory cells by programming a first portion of the cells in the second group to a new logical state while maintaining a second portion of the cells in the second group in the second baseline logical state.

17. The method of claim 16, in which each of the RRAM memory cells comprises a switching transistor in series with an RRAM element, the RRAM element comprising opposing first and second conductive electrodes separated by an intervening insulative layer.

18. The method of claim 17, in which the RRAM elements of the memory cells of the data storage array are programmable to different resistive states in relation to formation of conductive filaments which extend into the intervening insulative layer.

19. The method of claim 16, further comprising a step of performing a read verify operation upon the first group of RRAM memory cells to confirm the first baseline logical state has been successfully written to each of the RRAM memory cells in the first group.

20. The method of claim 16, further comprising a step of reading and temporarily storing, in a separate memory, protected data stored in the first group of RRAM memory cells prior to writing the first baseline logical state to the first group of RRAM memory cells, wherein the overwriting of user data to the first group of RRAM memory cells comprises transferring the protected data from the separate memory back to the first group of RRAM memory cells in the first group.

\* \* \* \* \*

UNITED STATES PATENT AND TRADEMARK OFFICE
CERTIFICATE OF CORRECTION

| | | |
|---|---|---|
| PATENT NO. | : 8,934,281 B2 | Page 1 of 1 |
| APPLICATION NO. | : 13/274876 | |
| DATED | : January 13, 2015 | |
| INVENTOR(S) | : Yiran Chen et al. | |

It is certified that error appears in the above-identified patent and that said Letters Patent is hereby corrected as shown below:

In Col. 11, line 33
"responsive to responsive to" should be "responsive to"

Signed and Sealed this
Seventeenth Day of May, 2016

Michelle K. Lee
*Director of the United States Patent and Trademark Office*